United States Patent [19]
Sriram

[11] Patent Number: 5,821,576
[45] Date of Patent: Oct. 13, 1998

[54] SILICON CARBIDE POWER FIELD EFFECT TRANSISTOR

[75] Inventor: Saptharishi Sriram, Monroeville, Pa.

[73] Assignee: Northrop Grumman Corporation, Los Angeles, Calif.

[21] Appl. No.: 745,975

[22] Filed: Nov. 8, 1996

Related U.S. Application Data

[63] Continuation-in-part of Ser. No. 544,626, Oct. 18, 1995.

[51] Int. Cl.$^6$ .................................................. H01L 29/80
[52] U.S. Cl. ......................... 257/284; 257/286; 257/330
[58] Field of Search ..................................... 257/284, 286, 257/76, 77

[56] References Cited

U.S. PATENT DOCUMENTS

| | | | |
|---|---|---|---|
| 4,984,036 | 1/1991 | Sakamoto et al. | 357/22 |
| 5,091,759 | 2/1992 | Shih et al. | 357/22 |
| 5,382,822 | 1/1995 | Stein | 257/410 |
| 5,399,883 | 3/1995 | Baliga . | |
| 5,455,432 | 10/1995 | Hartsell et al. | 257/77 |
| 5,510,630 | 4/1996 | Agarwal et al. | 257/77 |

OTHER PUBLICATIONS

"Split–Gate Field–Effect Transistor" by Michael Shur, *Appl. Phys. Lett.* 54 (2), Jan. 9, 1989.

*Primary Examiner*—Sara W. Crane
*Assistant Examiner*—Douglas A. Wille
*Attorney, Agent, or Firm*—Walter G. Sutcliff

[57] ABSTRACT

The invention provides for a field effect transistor (FET) which includes a substrate and a buffer layer formed upon the substrate and an active layer formed upon the buffer layer. The active layer includes a gate region, drain region and source region. In addition, a channel region is formed in the active layer intermediate the source region and drain region. The channel region includes a first portion of reduced thickness adjacent the drain region. The active layer may include a recess adjacent the drain region to provide the thin channel region. Preferably, the thickness of the first portion of the channel region is equal to the undepleted channel thickness within the second portion of the channel region adjacent the first portion. The substrate, buffer layer, active layer, and degenerate layers are preferably fabricated of silicon carbide or gallium nitride. Further, the FET preferably includes a p type buffer, n type active layer, and n+ degenerate layers. The FET may also include a surface-effect-suppressive layer which preferably covers portions of the active layer and the degenerate layers.

18 Claims, 5 Drawing Sheets

FIG.3
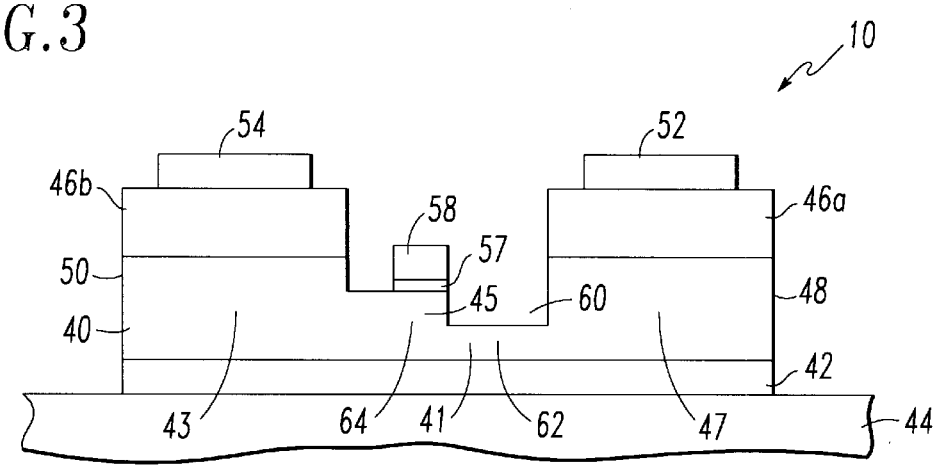
FIG.4
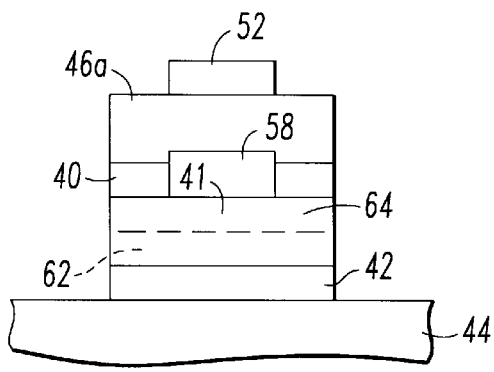
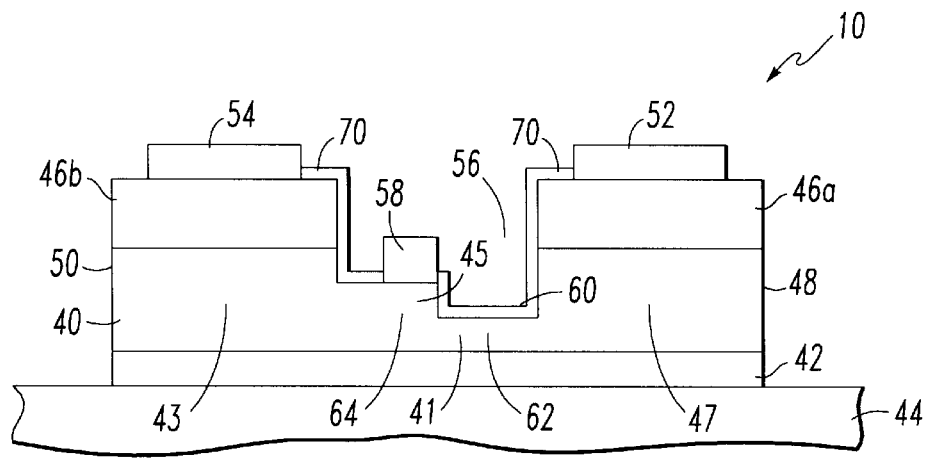
FIG.5

SILICON CARBIDE POWER FIELD EFFECT TRANSISTOR

RELATED APPLICATION

This application is a continuation-in-part of co-pending United States patent application entitled "Silicon Carbide Power MESFET", filed Oct. 18, 1995 and having Ser. No. 08/544,626, and hereby incorporated by reference.

BACKGROUND OF THE INVENTION

1. Field of the Invention

This invention relates to field effect transistors (FETs), and more particularly to power FETs which operate efficiently at elevated temperatures and RF frequencies and are less sensitive to temperature fluctuations.

2. Description of the Prior Art

A FET device that can deliver RF power with high gain and satisfactory efficiency is a requirement for many system applications. A device commonly used for these applications is the field effect transistor (FET). The FET is an attractive microwave device for implementation in wide bandgap semiconductors due to its simple structure, ease of fabrication and excellent radio frequency (RF) performance.

There exists a trade off between the breakdown voltage and the maximum drain current within FETs. The product of the breakdown voltage and maximum drain current represents the upper limit on the maximum power output achievable from the FET. In particular, the maximum power output is greatly dependent upon the electrical characteristics (i.e., saturation electron velocity, breakdown field strength, thermal conductivity, operating temperature range) of the specific semiconductor material utilized within the FET.

Silicon carbide (SiC) and gallium nitride (GaN) are wide energy bandgap (<3 eV) semiconductors and attractive materials for the fabrication of RF power FETs due to their unique combination of high saturated electron velocity ($>2.0 \times 10^7$ cm/s), high junction electric field breakdown strength ($2 \times 10^6$–$4 \times 10^6$ V/cm), high thermal conductivity (5 W/cm-°C.) and broad operating temperature range (1100° C.). Indeed, the thermal conductivity and breakdown voltage values for silicon carbide and gallium nitride are an order of magnitude greater than conventional semiconductor materials, such as Si, GaAs and Indium phosphide. In addition, the energy band gap and, therefore, the maximum operating temperature range of silicon carbide and gallium nitride, is at least twice that of conventional semiconductors.

These features are important to systems such as radar, which demand very high RF power requirements of system components, and avionics, which require stable device behavior under extreme operating temperatures. Also, because the silicon carbide crystal lattice and gallium nitride crystal lattice are inherently tolerant to radiation, the operations of devices fabricated from silicon carbide and gallium nitride are less susceptible to the effects of radiation than conventional semiconductor materials. As a result, silicon carbide and gallium nitride devices are useful in high radiation environments, including nuclear system and space applications.

In FETs fabricated of low mobility materials such as silicon carbide or gallium nitride, the FET channel current, transconductance, and RF gain are highly dependent upon the mobility of the particular material. Unfortunately, the mobility of such materials is reduced in the presence of high temperatures. The reduced mobility degrades the power performance of the FET and leads to variations in power levels during a long pulse in pulsed RF operation. Therefore, this dependability upon mobility becomes a problem when a FET fabricated of such materials is utilized within an environment wherein high temperatures are present.

Therefore, there is a need for a FET which may be fabricated of wide bandgap materials, such as silicon carbide and gallium nitride, and utilized in environments of elevated temperatures.

SUMMARY OF THE INVENTION

The invention provides for a field effect transistor (FET) which includes a substrate and a buffer layer formed upon the substrate and an active layer formed upon the buffer layer. The active layer includes a gate region, drain region and source region. In addition, a channel region is formed in the active layer intermediate the source region and the drain region. The channel region includes a first portion of reduced thickness adjacent said drain region.

The FET according to the present invention further includes a source degenerate layer and a drain degenerate layer on the respective source and drain regions of the active layer. A source contact and a drain contact are further provided on the source degenerate layer and the drain degenerate layer, respectively. A gate contact is further provided on the gate region of the active layer.

The active layer includes a recess adjacent the drain region and gate contact to provide a thin first portion within the channel region. Preferably, the cross-sectional area of the first portion is less than a second portion of the channel region adjacent the source region. Preferably, the thickness of the first portion of the channel region is equal to the undepleted channel thickness within the second portion of the channel region adjacent the first portion.

The substrate, buffer layer, active layer, drain degenerate layer and source degenerate layer are preferably one of silicon carbide or gallium nitride. Further, the field effect transistor preferably includes a p type buffer, n type active layer, and n+ degenerate layers.

The field effect transistor may further include a p+ silicon carbide region or silicon dioxide layer intermediate the gate contact and active layer to form a junction field effect transistor (JFET) or metal-oxide field effect transistor (MOSFET), respectively.

The field effect transistor may also include a surface-effect-suppressive layer which preferably covers portions of the active layer and the degenerate layers.

A complete understanding of the invention will be obtained from the following description and the accompanying figures.

BRIEF DESCRIPTION OF THE FIGURES

FIG. 3 is a schematic section similar to FIG. 2 of a second embodiment of a field effect transistor in accordance with the present invention.

FIG. 4 is a cross-sectional view of the field effect transistor taken along line IV—IV shown in FIG. 2.

FIG. 5 is a schematic section of a third embodiment of a field effect transistor in accordance with the present invention further including a surface-effect-suppressive layer.

DETAILED DESCRIPTION OF THE PREFERRED EMBODIMENTS

The invention provides a field effect transistor (FET) having a channel of reduced thickness within the gate-drain region of the active layer to improve the RF power and high temperature performance of the FET. Although the presently preferred embodiment of the present invention is described with respect to a MESFET, it must be understood that the present invention may be practiced with respect to other types of field-effect transistors, such as, for example, the metal-oxide semiconductor field-effect transistor (MOSFET) or the junction field-effect transistor (JFET).

Figure 1:
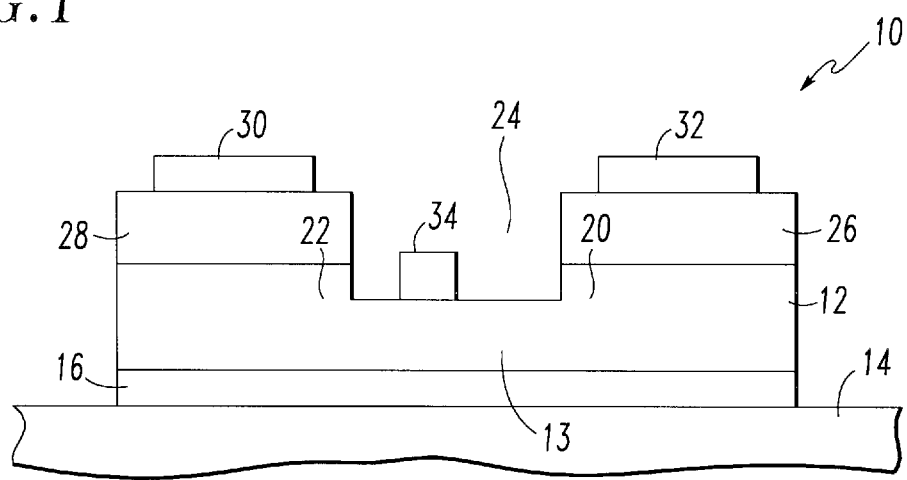
FIG. 1 is a schematic section of a conventional field effect transistor.

In FIG. 1, a FET 10 is shown in schematic section and is illustrative of prior art FETs which include channel region 13 of constant thickness in both the Gate-Drain region and the Source-Gate region of the active layer 12. The active layer 12 may be isolated from potentially deleterious interfacial effects with substrate 14 by the interposition of buffer layer 16.

A highly-doped contact degenerate layer is superimposed and affixed to the active layer 12. The degenerate layer can be selectively removed to form a drain mesa 20 and a source mesa 22, and to create a gate contact recess 24 thereby exposing a portion of the active layer 12.

The drain mesa 20 and the source mesa 22 may be used to isolate the source and drain regions and to separate the active channel regions from metal gate pads. The resistance between the channel and metal contact may be reduced by including a drain contact degenerate layer 26 and a source contact degenerate layer 28 on the upper horizontal surfaces of the drain mesa 20 and the source mesa 22.

A source ohmic metal contact 30 may be affixed to the source contact degenerate layer 28. Likewise, a drain ohmic metal contact 32 can be affixed to the drain contact degenerate layer 26.

The degenerate layers 26, 28 are preferably highly-doped to reduce the resistance between the contacts 30, 32 and the active layer 12. Specifically, it is preferred that the degenerate layers 26, 28 include n+ material which may be formed by ion implantation or by epitaxial growth, although materials with other conductivity types, and other film formation methods, may be used.

During the operation of the FET 10, a signal applied to a gate contact 34 selectively controls the current flow from the source contact 30, into the active layer 12 and through the channel region 13, and out to the drain contact 32.

The channel region 13 current, transconductance, and RF gain in FETs 10 fabricated of low mobility materials, such as SiC or GaN, are significantly dependent upon the mobility of the material. The mobility of such materials may be reduced within the presence of elevated temperatures. The performance of the FET 10 shown in FIG. 1 is highly dependent upon mobility and temperature. Therefore, the gain of a conventional FET 10 may vary greatly within the presence of high temperatures. Such a variation in the power level of a FET 10 is undesirable in system applications.

Figure 2:
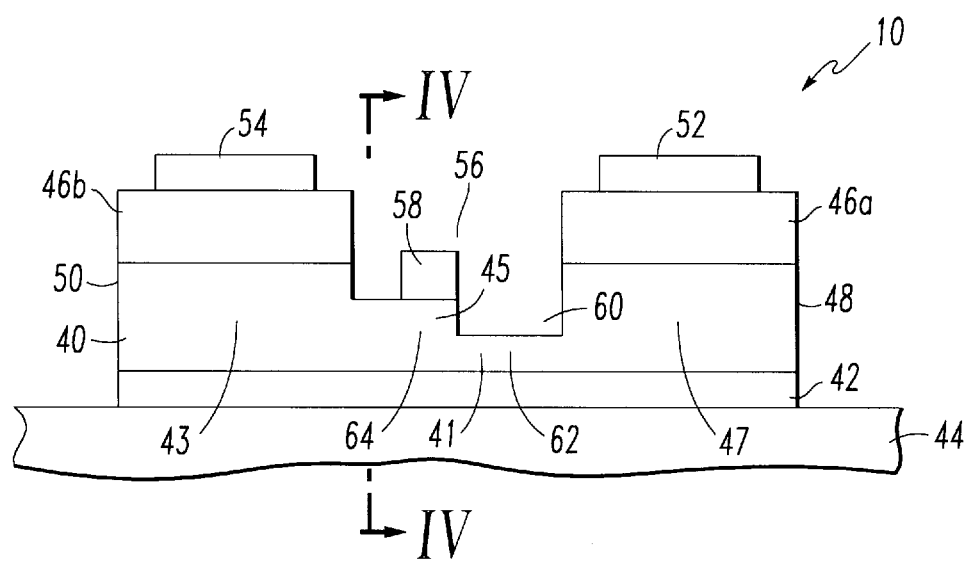
FIG. 2 is a schematic section of a first embodiment of a field effect transistor in accordance with the present invention.

One embodiment of a FET 10 in accordance with the present invention is shown in schematic section in FIG. 2. In particular, an active layer 40 may be mounted on a substrate 44. Preferably, the active layer 40 consists of n type material and the substrate 44 is made of high resistivity type material. The active layer 40 generally includes a source region 43, gate region 45 and drain region 47 as shown in FIG. 2.

A buffer layer 42 may be interposed between the active layer 40 and the substrate 44. The buffer layer 42 is preferably p type material to electrically isolate the active layer 40 and the buffer layer 44. It is preferred that the substrate 44, buffer layer 42 and active layer 40 be composed of SiC or GaN.

A contact degenerate layer 46 may be superimposed on the active layer 40. The contact degenerate layer 46 is preferably highly-doped and may consist of n+ type material and may be formed by ion implantation of epitaxial growth. The contact degenerate layer 46 may be selectively removed to expose a portion of the active layer 40 and form a gate recess 56, drain mesa 48 and source mesa 50. It is preferred that selective removal be performed by dry etching methods such as reactive ion etching (RIE).

The resistance between the channel and metal contact may be reduced by the presence of the drain contact degenerate layer 46a and source contact degenerate layer 46b on the upper surface of the drain mesa 48 and the source mesa 50, respectively. Further, a drain ohmic metal contact 52 and source ohmic metal contact 54 may be affixed to the respective drain contact degenerate layer 46a and source contact degenerate layer 46b. Metal is formed into the gate contact recess 56 and superimposed on the channel region 41 of the active layer 40 to form a gate metal contact 58.

The gate metal contact 58 may be superimposed directly on the channel region 41 of the active layer 40 to form a FET 10. Alternatively, as shown in FIG. 3, a layer 57 may be interposed between the gate metal contact 58 and the active layer 40 to form either a MOSFET or JFET. In particular, the layer 57 may be silicon dioxide to form a MOSFET or a p+ region to form a JFET.

The embodiments of the FET 10 in accordance with the present shown in FIG. 2 and FIG. 3 additionally includes a recess 60 within the active layer 40 to form a channel region 41 having a reduced thickness within the gate-drain region or first portion 62 of the channel region 41. In particular, the active layer 40 should be thinner within the first portion 62 as compared with a second portion 64 of the channel region 41 beneath the gate metal contact 58. Preferably, the thickness of the first portion 62 of the channel region 41 within the gate-drain region is approximately equal to the undepleted active layer 40 thickness within the second portion 64 of the channel region 41 on the drain side thereof.

The maximum drain current within the embodiment of the FET 10 shown in FIG. 2 and FIG. 3 is not limited by a channel region 41 having a reduced thickness within the first portion 62 and is the same as the prior art structure shown in FIG. 1.

FIG. 4 is a cross-sectional view of the first embodiment of the FET 10 in accordance with the present invention shown in FIG. 2. Referring to FIG. 4, the cross-sectional area of the first portion 62 of the channel region 41 is preferably less than the cross-sectional area of the second portion 64 of the channel region 41.

The gate-drain breakdown of a FET 10 is determined by the density of charges per $cm^2$ within the gate-drain region. The FET 10 in accordance with the present invention has less charge density within the gate-drain region as compared with conventional FETS as shown in FIG. 1. Therefore, the FET 10 in accordance with the present invention will have a higher voltage breakdown than conventional FETs 10 for the same maximum drain current. Accordingly, the FET 10 shown in FIG. 2 and FIG. 3 has a higher maximum power output than conventional FETs 10 having the same size.

Under full drain current conditions, electrons within the gate-drain region of the FETS 10 shown in FIG. 2 and FIG. 3 move at saturated velocity. However, the gate-drain region merely acts as a series resistance within a conventional FET 10 as shown in FIG. 1. The saturation of electron velocity within the FETS 10 in accordance with the present invention adds additional transit time which reduces $f_t$ and the gain of the device.

However, the reduction of saturated velocity in SiC at higher temperatures is much lower than the reduction of mobility. It follows that the RF performance of the FETs 10 in accordance with the present invention is less dependent upon temperature compared to the conventional FETs 10 shown in FIG. 1. The FETs 10 in accordance with the present invention are particularly suitable for wide bandgap materials such as SiC and GaN which have high electron velocity and low mobility.

The FETs 10 in accordance with the present invention additionally include the benefit having a much lower feedback capacitance which is usually dominated by the fringe capacitance within the gate region and drain region. Providing a lower feedback capacitance within this region improves the RF gain of the FET 10.

The FETS 10 shown in FIG. 2 and FIG. 3 provide limited benefits when utilized with materials such as GaAs which have high mobility and lower electron saturation velocity. Specifically, the extent of the depletion region under the gate metal contact 58 on the drain side is smaller and the advantage to be gained by including the recess 60 is limited.

As discussed in the parent application, it is believed that "surface effects" which include current flow in the surface of a FET 10 between the drain and gate thereof may cause transconductance dispersion, parasitic surface effects, as well as other unknown effects.

Referring to FIG. 5, the FETs 10 in accordance with the present invention may additionally include a surface-effect-suppressive layer 70. The surface-effect-suppressive layer 70 may be either thermally-grown or deposited silicon dioxide on a FET 10 which comprises silicon carbide. Additionally, silicon dioxide may be deposited on a FET 10 which comprises gallium nitride. Other insulators, such as, for example, silicon nitride may also be used.

Alternatively, the surface-effect-suppressive layer 70 may be formed by growing an undoped or lightly doped layer. The surface-effect-suppressive layer 70 may be subsequently etched away to form the FET 10.

The surface-effect-suppressive layer 70 may be pierced by the gate contact 58 for electrical connection thereof with the active layer 40. In this embodiment, surface effects between the source and gate, or the drain and gate can be both minimized and physically isolated from the signals being propagated within the active layer 40.

Referring to FIG. 5, a signal applied to the gate contact 58 selectively controls the current flow from source contact 54 into active layer 40 and channel region 41 thereof and out to the drain contact 52. Note that the electron flow between the drain contact 52 and the source contact 54 and the channel region 41 is effectively unimpeded by the surface-effect-suppressive layer 70.

A surface current between the gate contact 58 and either the source contact 54 or the drain contact 52 does not adversely affect the current passing through the active layer 40 of the FET 10 shown in FIG. 5 under small-signal conditions. In particular, the FET 10 of FIG. 5 does not suffer substantial inhibition of current in the active layer 40 or concomitant power loss under RF power conditions by gate-to-source or gate-to-drain surface current flow. It is hypothesized that the surface-effect-suppressive layer 70 isolates the surface effects from the active layer 40 and thus generally reduces the influence of some surface effects on the device behavior of the FET 10.

In this presently preferred embodiment, the surface-effect-suppressive layer 70 is an insulator which can be formed onto horizontal and vertical aspects of the gate contact recess 56. The surface-effect-suppressive layer 70 can be formed upon at least a portion of the selectively exposed portion of the active layer 40 and can extend to at least a portion of the surface of the drain contact degenerate layer 46a and source contact degenerate layer 46b, except at the drain contact 52 and source contact 54, respectively.

Similar to the FET 10 shown in FIG. 2, each of the buffer layer 42, active layer 40 and degenerate layers 46a, 46b may be composed of single-crystal films of silicon carbide or gallium nitride. It is also preferred that, when silicon dioxide is the insulator, the surface-effect-suppressive layer 70 be composed of a combination of thermal and CVD oxides.

The FET 10 shown in FIG. 5 may be formed as a MESFET or may include a layer of silicon dioxide or a p+ region interposed between the gate contact 34 and the active layer 40 to form a MOSFET or JFET, respectively.

Figure 6:
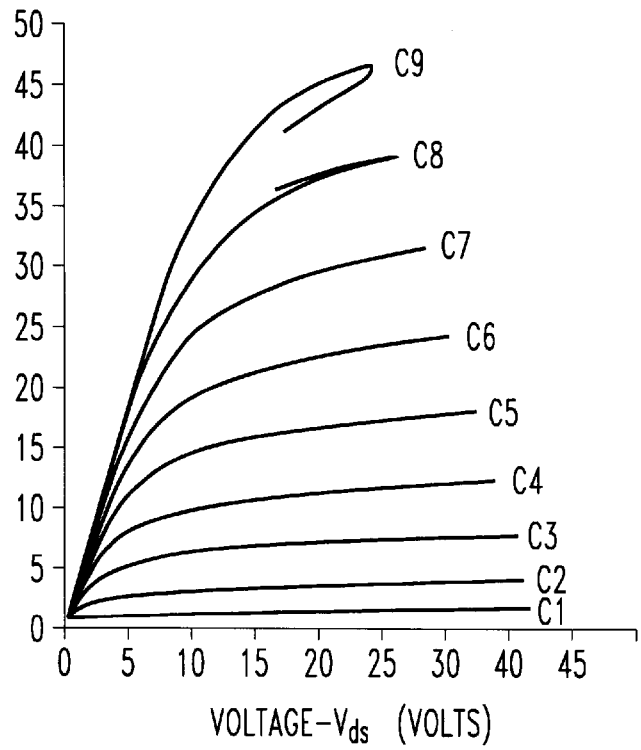
FIG. 6 is a diagrammatic representation of the current-voltage characteristic family of curves typical of a conventional MESFET.

FIG. 6 illustrates the I–V characteristic family of curves which are typical of FETS 10 which lack the recess 60 and thin first portion 62 within the channel region 41. As shown in FIG. 6, the characteristic curves $C_1$–$C_9$ represent the drain current ($I_d$) (ordinate) as a function of the drain-to-source voltage ($V_{ds}$) (abscissa). Each curve within each plot represents a particular value of gate-to-source bias voltage ($V_{gs}$) increasing in increments of 2 volts from $C_1$=–14 to $C_9$=2 volts. In addition, each horizontal division moving rightward represents a 5 volt increase in $V_{ds}$ and each vertical division moving upward represents a 5 mA increase in $I_d$.

Figure 7:
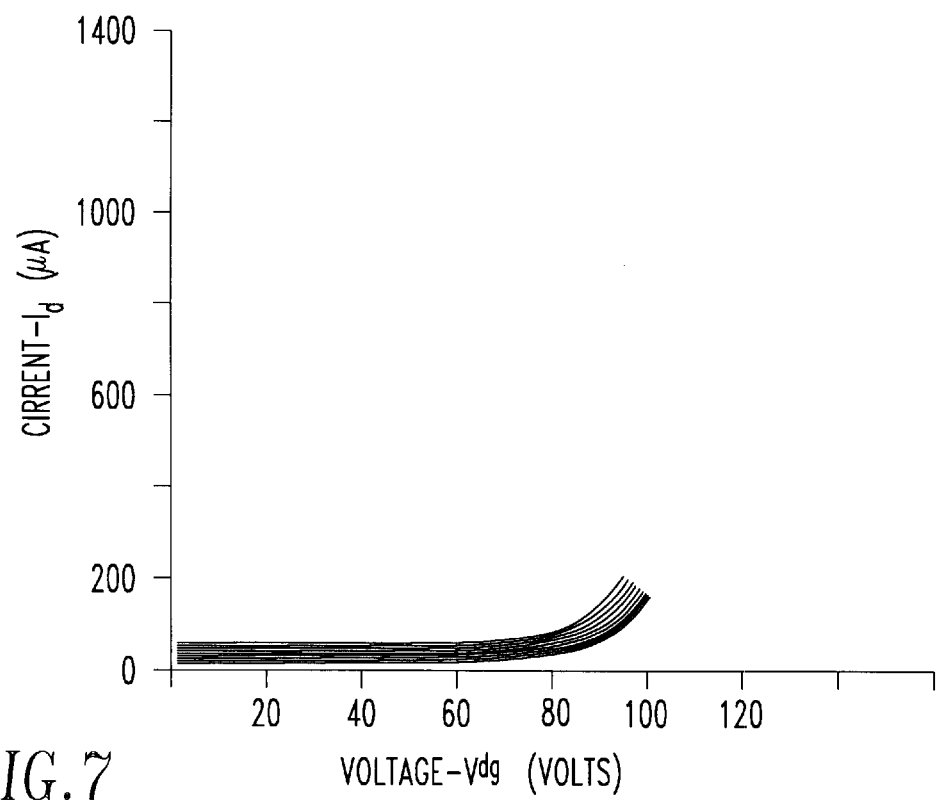
FIG. 7 is a diagrammatic representation of the breakdown voltage of a conventional MESFET.

The plot in FIG. 7 represents the breakdown voltage of conventional FETs 10 which lack a recess 60 and thin first portion 62 within the gate-drain region of the channel region 41. Each horizontal division moving rightward represents a 20 volt increase in $V_{dg}$. Each vertical division moving upward represents a 200 $\mu$A increase in $I_d$.

Figure 8:
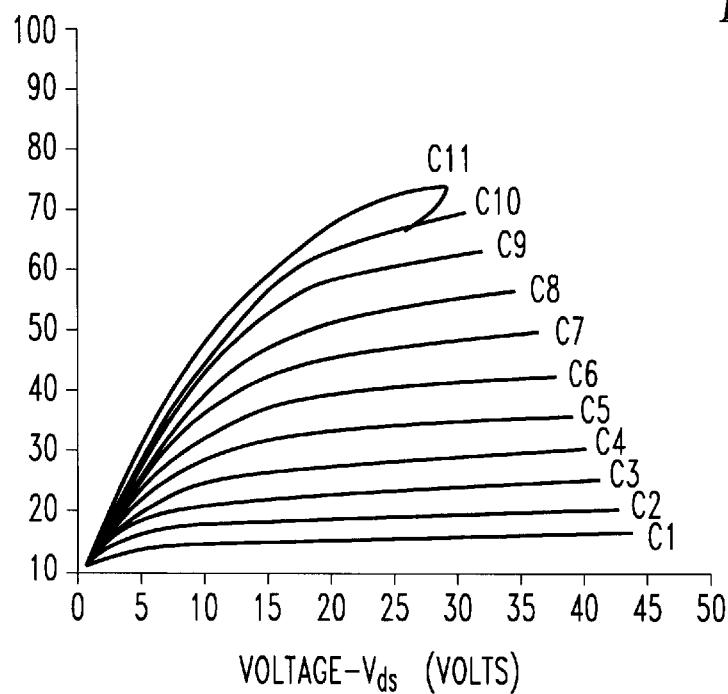
FIG. 8 is a diagrammatic representation of the current-voltage characteristic family of curves of a MESFET according to the present invention.

FIG. 8 illustrates the I–V characteristic family of curves of FETs 10 having a recess 60 and thin first portion 62 within the channel region 41 in accordance with the present invention. As shown in FIG. 8, the characteristic curves $C_1$–$C_{11}$, represent the drain current ($I_d$) (ordinate) as a function of the drain-to-source voltage ($V_{ds}$) (abscissa). Each curve within each plot represents a particular value of gate-to-source bias voltage ($V_{gs}$) increasing in increments of 2 volts from $C_1$=–18 to $C_{11}$=2 volts. In addition, each horizontal division moving rightward represents a 5 volt increase in $V_{ds}$ and each vertical division moving upward represents an 10 mA increase in $I_d$.

Figure 9:
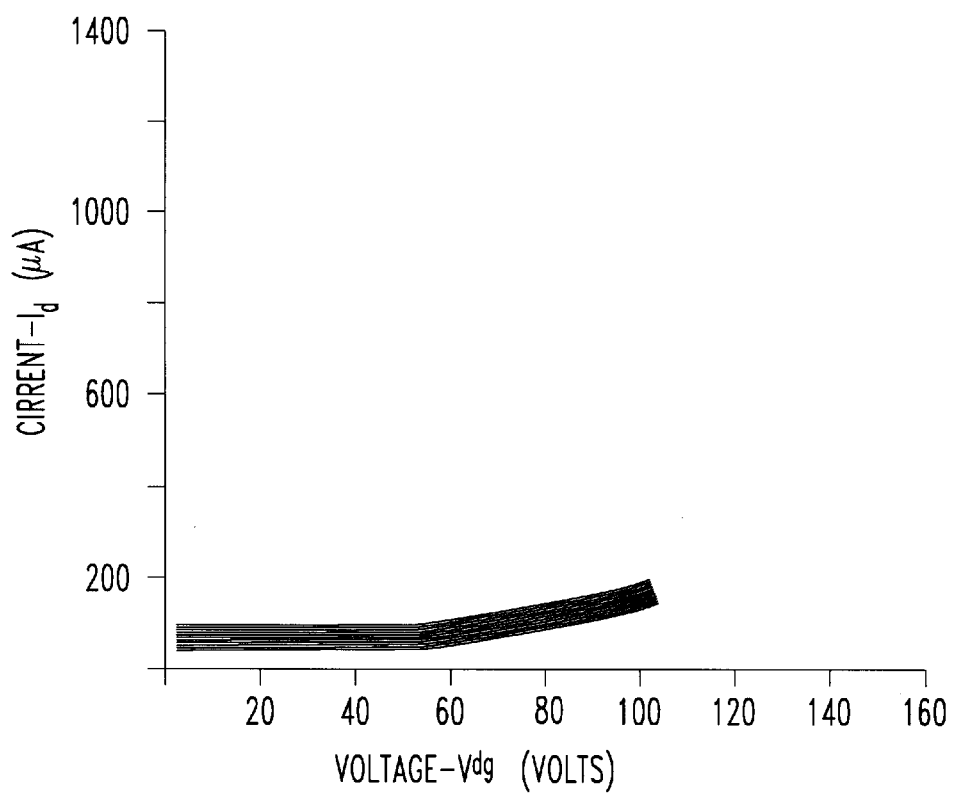
FIG. 9 is a diagrammatic representation of the breakdown voltage of a MESFET according to the present invention.

The plot in FIG. 9 represents the breakdown voltage of a FET 10 having a recess 60 and thin first portion 62 within the gate-drain region of the channel region 41. Each horizontal division moving rightward represents a 20 volt increase in $V_{gs}$. Each vertical division moving upward represents a 200 μA increase in $I_d$.

Comparing FIG. 6 and FIG. 7 corresponding to the conventional FETs 10, and FIG. 8 and FIG. 9 corresponding to FETs 10 having a recess 60 in accordance with the present invention, the FETs 10 in accordance with the present invention provide higher drain current $I_d$ and a slightly higher breakdown voltage. Therefore, the FETs 10 in accordance with the present invention provide improved power performance.

Figure 10:
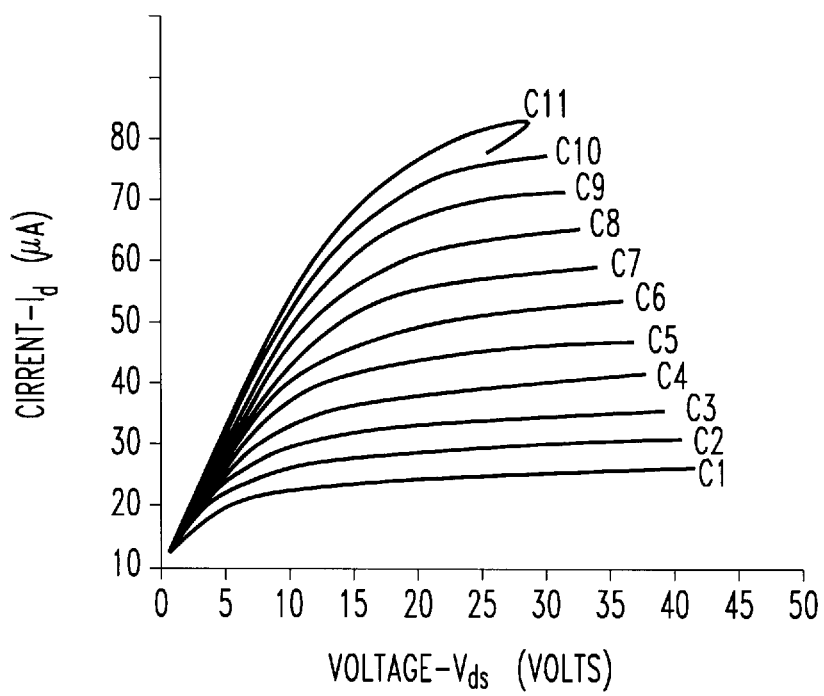
FIG. 10 is a diagrammatic representation of the current-voltage characteristic family of curves of a MESFET according to the present invention for higher gate forward bias voltages.

The plot of FIG. 10 illustrates the I–V characteristic family of curves of FETS 10 in accordance with the present invention at higher bias voltages ($V_{gs}$). Similar to FIG. 8, the characteristic curves $C_1$–$C_{11}$ represent the drain current ($I_d$) (ordinate) as a function of the drain-to-source voltage ($V_{ds}$) (abscissa). Each curve within each plot represents a particular value of gate-to-source bias voltage ($V_{gs}$) increasing in increments of 2 volts from $C_1$=−13 to $C_{11}$=7 volts. In addition, each horizontal division moving rightward represents a 5 volt increase in $V_{ds}$ and each vertical division moving upward represents an 10 nA increase in $I_d$.

Comparing FIG. 8 and FIG. 10, it is shown that a higher drain current $I_d$ is obtained by increasing the forward gate bias voltage $V_{gs}$ of the FETs 10 in accordance with the present invention.

While preferred embodiments of the invention have been shown and described herein, it will be appreciated by those skilled in the art that various modifications and alternatives to the disclosed embodiments may be developed in light of the overall teachings of the disclosure. Accordingly, the disclosed embodiments are meant to be illustrative only and not limiting to the scope of the invention which is to be given the full breadth of the following claims and all equivalents thereof.

I claim:

1. A field effect transistor comprising:
   a. a substrate;
   b. a buffer layer adjacent said substrate;
   c. an active layer adjacent said buffer layer and having a gate region and a drain region and a source region;
   d. a channel region formed in said active layer intermediate said source region and said drain region, said channel region including a first portion of reduced thickness between said gate region and said drain region;
   e. a source degenerate layer on said source region of said active layer;
   f. a drain degenerate layer on said drain region of said active layer;
   g. a source contact on said source degenerate layer;
   h. a drain contact on said drain degenerate layer; and
   i. a gate contact on said gate region of said active layer;
   j. the thickness of said first portion of said channel region between said gate region and said drain region being less than the thickness of said channel region under said gate contact.

2. The field effect transistor of claim 1 wherein the thickness of said first portion of said channel region is equal to the undepleted channel thickness within a second portion of said channel region adjacent said first portion.

3. The field effect transistor of claim 1 wherein the cross-sectional area of said first portion is less than a second portion of said channel region adjacent said source region.

4. The field effect transistor of claim 1 wherein said substrate, said buffer layer, said active layer, said drain degenerate layer and said source degenerate layer comprise silicon carbide.

5. The field effect transistor of claim 1 wherein said substrate, said buffer layer, said active layer, said drain degenerate layer and said source degenerate layer comprise gallium nitride.

6. The field effect transistor of claim 1 wherein said buffer layer is a p type.

7. The field effect transistor of claim 1 wherein said active layer is a n type.

8. The field effect transistor of claim 1 wherein each of said source degenerate layer and said drain degenerate layer is a n+ type.

9. The field effect transistor of claim 4 wherein said buffer layer is a p type, and said active layer is a n type and each of said source degenerate layer and said drain degenerate layer is a n+ type.

10. The field effect transistor of claim 5 wherein said buffer layer is a p type, and said active layer is a n type and each of said source degenerate layer and said drain degenerate layer is a n+ type.

11. The field effect transistor of claim 1 further comprising a silicon carbide layer intermediate said gate contact and said active layer.

12. The field effect transistor of claim 1 further comprising a silicon dioxide layer intermediate said gate contact and said active layer.

13. The field effect transistor of claim 1 further comprising a surface-effect-suppressive layer which covers a portion of said active layer.

14. The field effect transistor of claim 3 wherein said surface-effect-suppressive layer covers a portion of said source degenerate layer and said drain degenerate layer.

15. The field effect transistor of claim 13 wherein the thickness of said first portion of said channel region is equal to the undepleted channel thickness within a second portion of said channel region adjacent said first portion.

16. The field effect transistor of claim 13 wherein the cross-sectional area of said first portion is less than a second portion of said channel region adjacent said source region.

17. The field effect transistor of claim 13 wherein said buffer layer is a p type, and said active layer is a n type and each of said source degenerate layer and said drain degenerate layer is a n+ type.

18. The field effect transistor of claim 13 wherein said substrate, said buffer layer, said active layer, said drain degenerate layer and said source degenerate layer comprise one of silicon carbide and gallium nitride.

* * * * *